United States Patent [19]

Stewart

[11] 4,354,255
[45] Oct. 12, 1982

[54] RANDOM ACCESS MEMORY WITH VOLATILE AND NON-VOLATILE STORAGE

[75] Inventor: Roger G. Stewart, Neshanic Station, N.J.

[73] Assignee: RCA Corporation, New York, N.Y.

[21] Appl. No.: 144,922

[22] Filed: Apr. 29, 1980

[51] Int. Cl.[3] .................... G11C 11/40; G11C 9/00
[52] U.S. Cl. ................................ 365/154; 365/185
[58] Field of Search ............. 365/184, 185, 95, 228, 365/229, 154, 155

[56] References Cited

U.S. PATENT DOCUMENTS

| | | | |
|---|---|---|---|
| 4,070,655 | 1/1978 | Schurmeyer et al. | 365/184 X |
| 4,091,460 | 5/1978 | Schurmeyer et al. | 365/154 |
| 4,095,281 | 6/1978 | Denes | 365/184 X |
| 4,103,348 | 7/1978 | Fagan | 358/228 |
| 4,143,286 | 3/1979 | Koike et al. | 365/185 X |
| 4,149,268 | 4/1979 | Waters | 365/95 |
| 4,168,537 | 9/1979 | Uchida | 365/154 |

Primary Examiner—Bernard Konick
Assistant Examiner—Donald McElheny, Jr.
Attorney, Agent, or Firm—Samuel Cohen; Henry I. Schanzer

[57] ABSTRACT

A memory which is selectively operable either as a read-write volatile memory or as a non-volatile memory includes an array of memory cells with each cell comprising a volatile secion and a non-volatile section. The volatile section includes a volatile storage element which can be easily, quickly and repeatedly switched to either binary state. The non-volatile storage section includes a programmable non-volatile electrically alterable storage element and a switching transistor whose conductivity is controlled by the difference between the potential on a word line associated with the cell and one of the operating voltages applied to the volatile section of the cell. The switching transistor when "on" electrically connects the non-volatile section in circuit with the volatile section and when "off" electrically decouples the two sections. When the switching transistor is ON, information can be transferred between the volatile section and the non-volatile section.

7 Claims, 4 Drawing Figures

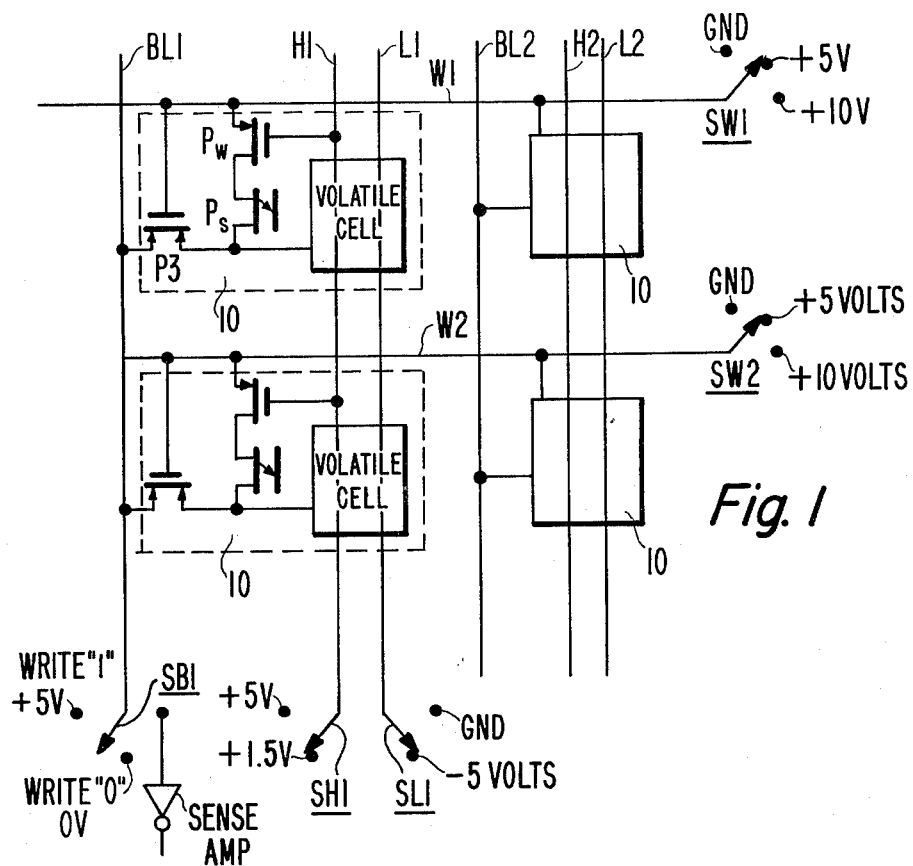
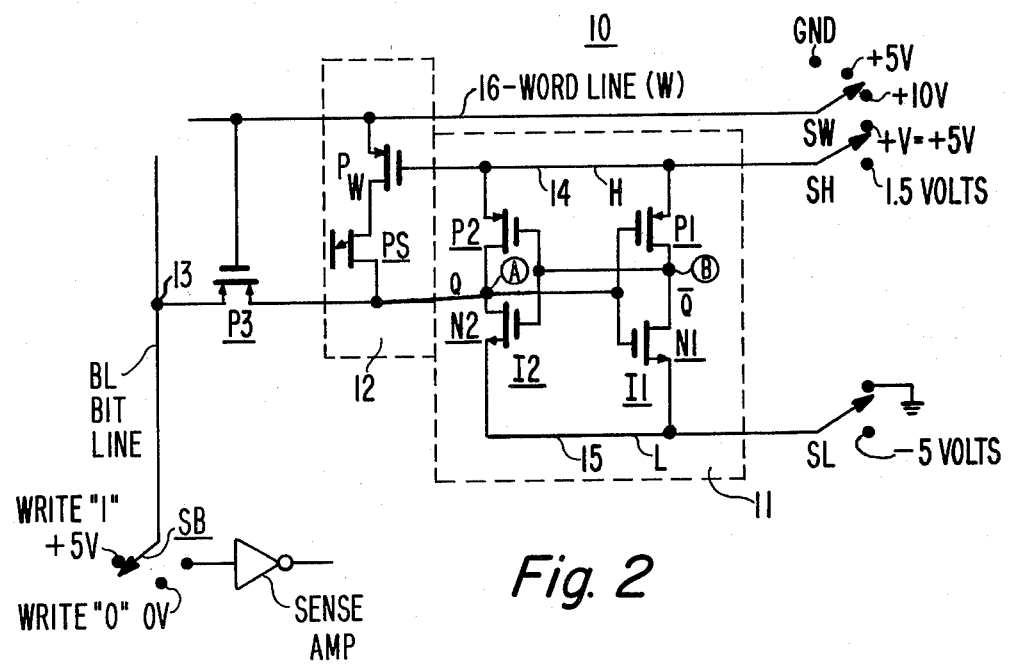
Fig. 1
Fig. 2

RANDOM ACCESS MEMORY WITH VOLATILE AND NON-VOLATILE STORAGE

The present invention relates to a random-access memory (RAM) and more particularly to a semiconductor RAM having volatile and non-volatile storage elements at each bit location.

Typically, read-write semiconductor memories are comprised of storage elements (e.g. flip-flops) which can be simply and quickly set or reset ("written") to either one of two binary states, and which have infinite "endurance"—i.e., they can be cycled (set and reset) an infinite number of times without change in their basic storage characteristics. However, these storage elements are volatile—i.e., they do not retain the stored information when power is removed.

The problem of volatility can be resolved by employing non-volatile storage elements which can assume either binary state. However, non-volatile storage elements suffer from one or more of the following drawbacks: (a) they are slow—a relatively long time is required to switch such an element to a desired state; (b) they require relatively high voltages and/or a relatively complicated sequence of signals to set them to a desired state; and (c) they have "limited endurance"—i.e., a non-volatile element can only undergo a limited number of programming cycles (write and erase) before its characteristics are significantly altered.

Methods of modifying read-write memories to provide non-volatile type storage have been suggested in the art. One method requires that the memory cells be formed with an inherent imbalance such that whenever power is removed and then reapplied, the memory assumes a preselected condition. Another method suggests the selective addition of capacitance to a cell node to bias the cell to a preferred state. These known arrangements, even where they permit selective addition of capacitance, have a deleterious effect on the operation of the cell during its normal read-write cycle.

In a memory array of cells embodying the invention, each cell includes a volatile section which is easily written to either binary state and a non-volatile section which is selectively switched in circuit with the volatile section. When the non-volatile section is not connected in circuit with the volatile section, it does not affect the direct current (D.C.) characteristics of the volatile section and has minimal effect on the alternate current (A.C.) characteristics of the volatile section.

In the accompanying drawings like reference characters denote like components; and FIG. 1 is a block diagram of a memory array embodying the invention;

FIG. 2 is a detailed schematic diagram of a memory cell of the array of FIG. 1 embodying the invention;

Figure 3:
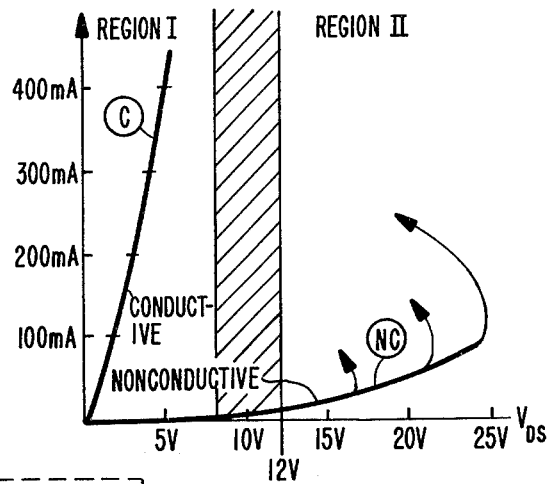
FIG. 3 is the current-voltage characteristic of a non-volatile floating-gate field-effect transistor suitable for use in circuits embodying the invention.

FIG. 1 shows two rows and two columns of an array of memory cells 10 arranged in rows (words) and columns (bits). There is one word line ($W_1$, $W_2$) per row, one bit line (BL1,BL2) per column, one line ($H_1$, $H_2$) per column for distributing the more positive (+5 volts or +1.5 volts) operating potential to the cells of that column, and one line ($L_1$, $L_2$) per column for distributing the more negative (ground or −5 volts) operating potential to the cells of that column.

The operation of the array is best explained by examining the detailed schematic of cell 10 shown in FIG. 2. The cell includes a volatile section 11 with an input-output (I/O) point A, a non-volatile section 12, and a "pass" transistor P3 for selectively coupling point A to a bit line (BL).

Section 11 is a flip-flop comprised of two cross-coupled complementary inverters I1 and I2. Inverter I1 includes transistors P1 and N1 and inverter I2 includes transistors P2 and N2. The sources of transistors P1 and P2 are connected to the H-line 14 and the sources of transistors N1 and N2 are connected to the L-line 15. The drains of transistors P2 and N2 are connected to each other and to the gates of P1 and N1 at node A which defines the Q output of the flip-flop. In a similar manner the drains of transistors P1 and N1 are connected to each other and to the gates of transistors P1 and N2 at node B which defines the complementary or $\bar{Q}$ output of the flip-flop.

Section 12 includes a non-volatile floating gate FET, $P_S$, functioning as a non-volatile storage or memory device and a word line switching transistor $P_W$. $P_W$ is connected at its source to a word line 16 and at its gate electrode to H-line 14. The conduction paths (source-to-drain paths) of $P_W$ and $P_S$ are connected in series between word line 16 and node A. $P_S$ may be formed, by way of example, as taught in my copending application titled "Non-Volatile Memory Device" filed Oct. 11, 1978, bearing Ser. No. 948,507 now U.S. Pat. No. 4,185,319 issued Jan. 22, 1980 and also assigned to the assignee of the present application. The structure and operation of the floating gate FET, $P_S$, is known in the art and need not be greatly detailed. Suffice it to say that the floating gate is an island of conductive material surrounded by an insulator (oxide) which is coupled capacitively to a silicon substrate with which it forms a transistor. The presence or absence of charge on the floating gate determines whether the transistor is on or off. Charge once placed on the gate (and with the charging voltage removed) will remain trapped indefinitely since the oxide normally acts as a barrier to the flow of current.

$P_S$ has a "conductive" state and a "non-conductive" state. $P_S$ is set from the non-conductive to the conductive state by applying a "stress" potential across its source-to-drain path in excess of a given voltage which in this application is assumed to be 12 volts. In the conductive state $P_S$ functions essentially as a resistive element exhibiting the response shown by curve C in Region 1 of FIG. 3. Once set to the conductive state $P_S$ will remain in that state even after the stress potential is removed, (i.e., $P_S$ is a non-volatile storage element).

Once in the conductive state $P_S$ may be reset ("erased") to the non-conductive state by applying ultraviolet light onto the transistor or by applying relatively large voltages (e.g. 100 volts) to a gate electrode (not shown) overlying (and isolated from) the floating gate and the substrate region of $P_S$. In the non-conductive state $P_S$ exhibits the characteristics corresponding to curve NC shown in FIG. 3. It then has a very high source-to-drain impedance and it its assumed that no current flows in its source-drain path. Once rendered non-conductive $P_S$ will remain in the non-conductive state until its source-drain path is stressed by a voltage equal to or greater than 12 volts.

Gating or "pass" transistor P3 (which is preferably selected to have a lower impedance conduction path than transistors P2 and N2 for the same value of forward gate to source bias) has its conduction channel connected between node A and the bit line and its gate electrode connected to word line 16. When P3 is turned on, node A is closely coupled to the bit line. When P3 is turned off sections 11 and 12 may be considered to be electrically disconnected from the bit line. Word line 11, is common to all of the memory cells of the same word in a word organized memory. By the same token, the bit line is common to all of the bits of like significance in the several words.

Word line 16 is connected to a switch SW which may be used to apply either +10 volts, +5 volts, or ground to the word line. H-line 14 is connected to a switch SH which may be used to apply either +5 volts or +1.5 volts to the H-line, and L-line 15 is connected to switch SL which may be used to apply either ground or −5 volts to the L-line. The bit line is connected to a switch SB which may be used to apply +5 volts or 0 volt to the bit line during write and which may be used to connect the bit line to a sense amplifier during read.

The memory cell may be operated in any of the following ways:

I. as a read-write memory when only the volatile section 11 is selectively connected to the bit line;

II. such that the information stored in section 11 is transferred to section 12 for non-volatile storage;

III. such that the information in non-volatile section 12 is transferred into the flip-flop 11; or IV. as a read-only memory (actually a read "mostly" memory).

These modes of operation are now detailed with reference to FIG. 2.

I. Normal Read-Write Operation of the Memory Array

In the normal read-write mode of operation, the following conditions exists: (1) +5 volts is applied to H-line 14 and ground potential is applied to L-line 15 by means of switches SH and SL, respectively; (2) 0 volts or +5 volts is applied to word line 16 by means of row selector switch SW. Applying 0 volts to the word line turns on P3 and selects the cell (for read or write), while applying 5 volts to the word line turns off P3 and maintains the cell decoupled from the bit line; (3) the source electrode of $P_W$ is connected to the word line. Hence, its source will be either at +5 volts (if the cell is not selected) or at 0 volts (if the cell is selected) while its gate connected to H-line 14 is at +5 volts. Consequently, $P_W$ is turned off during the normal read-write mode. Since $P_W$ is turned-off, its conduction path presents an extremely high impedance in series with the conduction path of $P_S$. Therefore, $P_S$ is, effectively, not connected in circuit with node A of the flip-flop during the normal read-write cycle of the memory array and has virtually no effect (except for some slight capacitance) on the operation of the cell.

Information is written into flip-flop 11 by turning on P3 and applying the information to be written onto the bit line by means of swtich SB. A "high" (e.g. +5 volts) on the bit line is coupled via the conduction path of P3 to node A causing $\overline{Q}$ at output node B to go low. This in turn causes the input of I2 to go low regeneratively pulling node A to the level V=+5 volts on the H line 14 via P2. A "low" (e.g. 0 volts) on the bit line is coupled to node A via P3 causing node B to go high which is then applied to the input of I2 causing node A to be regeneratively clamped to zero volts via N2.

Information is read-out of the cell by turning on P3 and coupling the level at node A onto the bit line and then via SB to the sense amplifier 31.

II. Data Transfer from Volatile to Non-Volatile Store

To effectuate a transfer of information from section 11 into non-volatile store section 12, transistor P3 is turned-off, transistor $P_W$ is turned-on, and the "low" level stored in flip-flop 11 is level shifted down from 0 volts to −5 volts as described below:

(1) Switch SH is set to apply +5 volts to H-line 14, while switch SL is set to apply −5 volts to line 15. With H-line 14 at +5 volts and L-line 15 at −5 volts, a "high" signal at node A or node B remains at the +5 volts level. However, a "low" signal at node A or node B goes from 0 volts to −5 volts. That is, if a "low" of zero volts is stored at node A or node B when L-line 15 is at ground, that "low" goes to −5 volts when −5 volts is applied to line 15. Thus, with H-line 14 at +5 volts and L-line 15 at −5 volts the voltage at node A is either at +5 volts (high) or at −5 volts (low). The "low" of −5 volts is necessary to render $P_S$ conductive if node A is "low".

(2) Switch SW is set to apply +10 volts to the word line. Transistor $P_W$ is turned on hard since its source is now at +10 volts while its gate (H-line 14) is at +5 volts. The conduction path of $P_S$ is then connected in series with the low-ON-impedance conduction path of $P_W$ between the word line and node A. The +10 volts on the word line maintains P3 turned off during the entire transfer mode.

(3) For the conditions above, the information in flip-flop 11 can be transferred to section 12 where $P_S$ is in its non-conductive state prior to the transfer.

(a) If node A is storing a "high" node A is at +5 volts. Recall that transistor $P_W$ is turned on hard, and its drain is driven up to, or close to, +10 volts. Hence, the source of $P_S$ is also at +10 volts, while its drain, connected to node A, is at +5 volts. Consequently, the potential differential between the source and drain of transistor $P_S$ is equal to +5 volts. This potential is insufficient to alter the state of $P_S$ which remains in its non-conductive state and which will continue to have the characteristics shown for curve NC in FIG. 3.

(b) If node A is storing a "low" node A is at −5 volts and the drain electrode of $P_S$ is likewise at −5 volts. Recall that $P_W$ is turned on hard. Therefore, its drain and the source of $P_S$ will be driven to, or close to, +10 volts. The potential differential across the source-drain path of $P_S$ is then 15 volt causing $P_S$ to avalanche, turn resistive and go into the conductive state shown as waveform C in FIG. 3. $P_S$ will then remain in the conductive state even after power is removed as noted above. [Needless to say, flip-flop 10 is designed such that it will not be upset following the turn-on or setting of $P_S$ to its conductive state. The high (10volts) gate drive on N2 allows it to better conduct the program current without upset of the latch.]

III. Transfer from Non-Volatile to Volatile Section

To transfer the information from the non-volatile section 12 into the flip flop 11, the latter is first reset so that the Q output (node A) is low. This may be done by momentarily turning on P3 and applying a low onto the bit line which is then written into the cell. Just prior to transferring information from section 12 to section 11 the positive operating voltage applied to the latter is temporarily decreased from +5 volts to 1.5 volts by means of setting SH to the +1.5 volts position while the potential on L-line 15 is held at ground. Lowering the operating potential from +5 volts to 1.5 volts decreases the drive of the cell and makes it easier for section 12 to set flip-flop 11. It also turns $P_W$ on harder and therefore, provides more drive to set the cell.

The contents of section 12 may then be transferred to section 11 by applying a potential ranging from +5 volts to +10 volts on word line 16. $P_W$ is turned on since its source (at +5 volts or more) is significantly more positive than its gate (at 1.5 volts). The current flowing through $P_W$ and $P_S$ and the voltage applied to node A is then a function of the conduction state of $P_S$.

(a) Where $P_S$ is in the conductive state, conduction occurs between the word line and node A via the conduction paths of $P_W$ and $P_S$ driving node A towards the potential on the word line. This ensures that Q (node A) is driven high (1.5 volts) and $\overline{Q}$ (node B) is low (0 volts). When the potential applied to line 14 via switch SH is subsequently raised to +5 volts node A remains high and goes to +5 volts while node B remains and stays low (0 volts).

(b) Where $P_S$ is in the non-conductive state, transistors $P_W$ and $P_S$ will not conduct even with $P_W$ turned on. As a result, node A remains low and node B remains high. Consequently, when the potential on line 14 is subsequently raised to +5 volts, node A remains set low to 0 volts and node B remains set high and goes to +5 volts.

As is evident from the discussion above, the operating voltage to the volatile section is controlled to ease the transfer of information.

During transfer of information from the flip flop to the non-volatile section, the voltage across the flip flop is increased to 10 volts to provide more drive for the flip flop to write or set the non-volatile section.

During transfer of information from the non-volatile element to the flip flop the voltage across the flip flop is decreased, enabling the non-volatile element to more easily write or set the flip flop.

IV. Read Out of Transferred Information

For the arrangement shown in FIG. 2, P3 and $P_W$ cannot be easily turned on simultaneously. Therefore, the information stored in section 12 is read-out by first transferring its contents into section 11 and then by reading out the transferred information onto the bit line, as discussed above for the normal read-write mode. The circuit of FIG. 2 could be modified such that the source of electrode $P_W$ is connected to a different control or word line than the gate electrode of P3. The information stored in section 12 could then be read-out directly via P3 onto the bit line. For such an arrangement (not shown) the gate electrode of P3 may be driven to 0 volts (to turn-off P3) and the source of $P_W$ may be driven to +5 volts. Thus, if $P_W$ is turned on and $P_S$ is in its conductive state, current can flow from the source of $P_S$ via the conduction paths of $P_S$ and $P_W$ into the bit line raising the bit line potential towards the "high" level. If $P_W$ is turned on and $P_S$ is non-conductive then no current flows into the bit line, which will remain at, or close to, the ground level to which it was discharged prior to read out.

Recall that when the contents of the volatile section are transferred to the non-volatile section that a "low" at node A causes $P_S$ to be rendered conductive, and that a "high" at node A caused $P_S$ to remain non-conductive. However, when the contents of section 12 are transferred back into the flip flop, if $P_S$ is in the conducting state it causes node A to go "high" while if $P_S$ in the non-conducting state it causes node A to remain "low". There is, therefore, inversion of data. This problem may be resolved by writing into flip flop 11 the inverse of the information to which section 12 is to be set. Alternatively, following the transfer of information from section 12 into the flip-flop, the contents of the flip-flop may be applied to the input of an inverter (not shown) and the output of the inverter may then be applied to the bit line and rewritten into section 11. An alternate solution which automatically takes care of the inversion insofar as the user is concerned is shown in FIG. 4.

Figure 4:
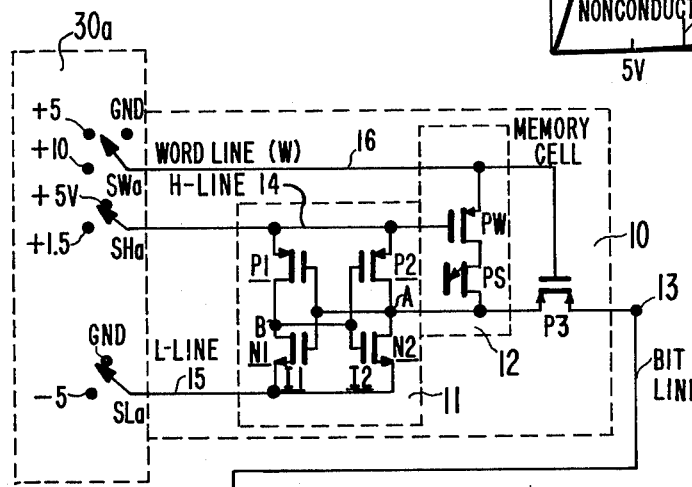
FIG. 4 is a schematic diagram of a circuit embodying the invention.
Figure 4:
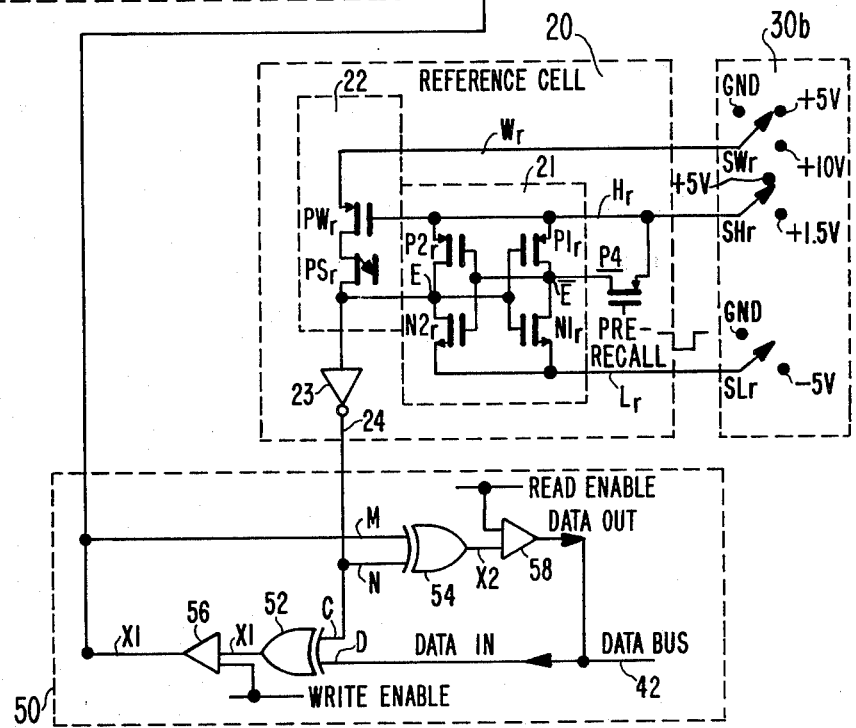

In FIG. 4 data input present on a data bus 42 is written into, and read-out of the memory cell via read/write circuitry 50 to which is also applied the output of a reference cell 20.

Reference cell 20 includes a volatile section (VS) 21 which is schematically identical to volatile section 11, and a non-volatile section (NVS) 22 which is identical to section 12. The source of the transfer control transistor PWr in section 22 is connected to a line Wr. The gate of PWr and the sources of flip-flop transistors P1r and P2r are connected to a line Hr and the sources of flip-flop transistors N1r and N2r are connected to a line Lr.

The reference cell has an internal output point E which is connected to the input of an isolating buffer inverter 23 whose output 24 is connected to one of the two inputs of Exclusive-OR gates 52 and 54 in circuit 50.

The reference cell also includes a resetting transistor P4 having its conduction path connected between a H-line 14 and a node $\overline{E}$ to which are connected the drains of P1r and N1r and the gates of P2r and N2r, and having a gate electrode to which is applied a preRecall pulse.

Furthermore, cell 20 is "keyed" via control circuit 30 to cell 10. The reference cell is keyed or controlled to ensure that, whenever the contents of the memory cell are transferred from volatile store to non-volatile store and then recalled back to volatile store, the reference cell undergoes a like cycle.

Control circuit 30b includes a switch SWr connected to line Wr for applying to it either ground (GND), +5 volts, or +10 volts; a switch SHr connected to line Hr for applying to it either +5 volts or +1.5 volts; and a switch SLr connected to line Lr for applying to it either ground or −5 volts.

The write portion of Read-Write circuit 50 includes a first two-input Exclusve-OR gate 52 having one input designated as "D" connected to Data Bus 42, its other input designated as "C" connected to reference cell output 24 and having an output designated as X1 connected to one input of a two input AND gate 56. The other input of gate 56 is connected to a write enable terminal. When the write enable signal is in the enabling mode the output of gate 56 is logically identical to X1 and is, for ease of discussion, also designated as X1. X1, the output of gate 56, is applied to the bit line connected to terminal 13. The read portion of circuit 50 includes a second two-input Exclusive-OR gate 54 having one input designated as "M" connected to the bit line and terminal 13, and its other input designated as "N" connected to reference cell output 24. The output of gate 54 designated as X2 is applied to one input of two-input AND gate 58, the other input to gate 58 is a read enable signal. When the latter is in the enable mode the signal at the output of gate 58 is logically identical to the value of X2 and is applied to bus 42.

A data input "D" on bus 42 applied to gate 52 causes the output X1 of gate 52 to be equal to "1" if C≠D and X1 to be equal to "0" if C=D. X1 is transferred without change in its binary significance via AND gate 56, when the latter is enabled, onto the bit line and terminal 13. The value of X1 can then be written into memory cell 10 by turning on P3. A "high" at terminal 13 causes A to go "low". During WRITE, P3 is turned on by applying 0 volts to word line 16 and the flip-flop is powered by applying +5 volts to line 14, and ground to line 15. Concurrently, during WRITE, lines Wr and Hr of the reference cell and line 14 of the memory cell are held at +5 volts whereby transistors PWr and PW are turned off. Consequently, during WRITE, reference cell 20 remains in whatever stable state it was in prior to the writing of information into cell 10. Hence, the reference cell output at terminal 24 then has the same value as the signal "C", applied to gate 52 to produce the X1 output being written into the memory cell.

The information stored in the memory cell can be selectively read out by turning on P3 and coupling node A onto terminal 13 and the bit line. If A is "high" the bit line goes "high" and if A is low the bit line goes "low". Assuming no inversion within the memory cell, its contents are read out onto the bit line and the signal applied to the bit line is of identical significance to the value on the bit line previously written into the memory cell. With no inversion in the memory cell, the reference cell output remains in the state it had when the data input was applied to gate 52 and the corresponding information was written into cell 10. Consequently, the N input to gate 54 is of like significance to the C input to gate 52 and the M input to gate 54 is of like binary significance to the X1 output of gate 52.

It is readily demonstrated that for this combination the output of gate 54 is always of like binary significance to the data input (D) applied to gate 52 as discussed below.

(a) Assume D is equal to 1 and C is equal to 0. Then, X1 is equal to "1". But, since M=X1="1" and N=C is still equal to "0" then X2 is equal to "1". X1 is then of the same binary significance as D and X2 is of identical binary significance to X1.

(b) Assume D is equal to "1" and C is equal to "1". Then X1 is equal to "0". But, since M=X1="0" and N=C="1" then X2 is equal to "1". The signal D has in effect undergone two inversions, one through X1 and another through X2. But, the end result is that X2 is of like binary significance to the signal D.

A similar analysis applied when D is equal to "0" and C is either "1" or "0" and need not be repeated.

Assume now that the information in VS section 11 is transferred to NVS section 12. However, when that occurs a transfer of information also occurs between VS section 21 and NVS section 22 of the memory cell. During transfer, +10 volts are applied to lines 16 and Wr via switches SWa and SWr, respectively; +5 volts are applied to lines 14 and Hr via switches SHa and SHb, respectively; and −5 volts are applied to lines 15 and Lr via switches SLa and SLb, rspectively. Transistors PW and PWr are turned on and the voltage across the VS sections is increased to enable the contents of section 11 to be transferred to section 12 and the contents of section 21 to be transferred to section 22. As noted above, under these transfer conditions a "high" at node A causes $P_S$ to remain "non-conductive" while a "low" at node A causes $P_S$ to become "conductive". Similarly a "high" at node E causes $P_{Sr}$ to remain "non-conductive" while a "low" at node E causes $P_{Sr}$ to become "conductive".

The information stored in the non-volatile storage section may be selectively recalled (transferred back) to the volatile section.

Prior to recalling the information from NVS section 12 to VS section 11, the volatile section 11 is set so that node A is set low. This may be accomplished by applying a zero to the bit line and writing that into the cell, or by the use of other reset means (not shown).

In a similar manner, a prerecall pulse is applied to transistor P4 to turn it on and cause node E to go low. Following the setting of nodes A and E to the low level the following conditions are generated to effectuate the transfer of information back from the non-volatile section to the volatile section. +10 volts are applied to lines 16 and Wr; +1.5 volts are applied to lines 14 and Hr; and 0 volt is applied to lines 15 and Lr. If $P_S$ is conductive, node A will be driven high while if $P_S$ is non-conductive node A remains low. Similarly, if $P_{Sr}$ is conductive node E is driven high while if $P_{Sr}$ is non-conductive node E remains low.

Following this step, +5 volts are applied to lines 16 and Lr and to lines 14 and Hr. This turns off the PW transistors and essentially decouples the non-volatile sections from the volatile sections. Sections 11 and 21 then latch up to the signal condition transferred back into the cell. The newly written condition cause the volatile section to assume a state which is the inverse of the state originally present in the volatile section and written into the non-volatile section.

However, note that the reference cell as well as the memory cell has undergone an inversion.

It will now be shown that, when there is an inversion in the data read-out of the memory cell and a concurrent inversion in the data contained in the reference cell, the read/write circuitry 50 in combination with reference cell 20 compensates for the inversion and provides a data output X2 of like binary significance to the data input, "D".

Since the output of the memory cell is the inverse of the information (X1) written into the memory cell, the signal M applied to gate 54 is equal to $\overline{X1}$. Similarly, since the output of the reference cell is the inverse of the signal applied to gate 52 to generate X1, the signal N applied to gate 54 is equal to $\overline{C}$.

The value of the two inputs M=$\overline{X1}$ and N=$\overline{C}$ to gate 54 are now the inverse of what they were M=X1 and N=C prior to the inversion of the memory and reference cells.

It can readily be shown that the output of an Exclusive OR gate does not change if its two inputs are inverted. Hence, the output of gate 54 is the same as for the case when the reference cell output and the memory cell outputs were not inverted. Hence, once again the output of gate 54 and the output of gate 58 are in phase with the data input signal originally present on the data bus.

In the circuit of FIGS. 1, 2 and 4 the non-volatile section 12 is shown connected between the word line and node A. However, it should be evident that section 12 could be, alternatively, connected between the word line and node B. It should also be evident that the memory cell could include another pass transistor, similar to P3, connected between node B and a bit line bearing data of a complementary nature to that on the bit line coupled to node A.

The non-volatile section could include a programmable device of a different type than the one shown in FIG. 2 and having the characteristics displayed in FIG. 3. Furthermore, the non-volatile element could also be a fixed non-programmable element of the type used to form read-only memories and could be located at either the source or drain side of PW.

What is claimed is:

1. The combination comprising:
   a volatile binary storage element having first and second power terminals for the application of an operating potential therebetween and having first and second input output (I/O) points;
   a bit line, and a word line;
   a gating transistor having a conduction path and a control electrode; means connecting said conduction path of said gating transistor between one of said I/O points and said bit line; and means connecting said control electrode to said word line;
   a non-volatile storage element which can be programmed to either one of two conductive states; and
   a switch means, coupled to said non-volatile storage element, responsive to a given potential difference applied between said word line and one of said first and second power terminals for selectively connecting said non-volatile storage element in circuit with said volatile binary storage element between said word line and one of said first and second input-output points.

2. The combination as claimed in claim 1 wherein said switch means includes a switching transistor having first and second electrodes defining the ends of its conduction path and a control electrode, means connecting said conduction path of said switching transistor between said word line and said non-volatile storage element, and means connecting said control electrode of said switching transistor to said one of said first and second power terminals.

3. The combination as claimed in claim 2 wherein said non-volatile storage element is a normally non-conducting floating gate insulated-gate field-effect transistor having a conduction path and said non-volatile element assuming a conduction state in response to the application of a voltage greater than a given voltage $V_R$ across its conduction path.

4. The combination as claimed in claim 3 wherein said volatile storage element includes first and second inverters, each inverter having an input, an output and first and second operating voltage terminals,
   wherein the output of the first inverter is connected to the input of the second inverter at said first input-output point and the output of the second inverter is connected to the input of the first inverter at said second input-output point;
   wherein the first operating voltage terminals of said first and second inverters are connected to said first power terminal; and
   wherein said second operating voltage terminals of said first and second inverters are connected to said second power terminal.

5. The combination as claimed in claim 2 further including means for selectively applying potentials to said word line and said power terminals for turning-on said gating transistors while concurrently turning off said switching transistor, and
   for selectively turning on said switching transistor while concurrently turning off said gating transistor.

6. The combination as claimed in claim 1 including means for:
   (a) applying a given operating potential across said first and second power terminals of said volatile storage element when information is being written into said volatile section from said bit line or read out from said volatile section onto said bit line;
   (b) increasing said operating potential across said volatile storage element when information is being transferred from said volatile section to said non-volatile section; and
   (c) decreasing the operating potential across said volatile storage element when information is being transferred from said non-volatile section to said volatile section.

7. The combination comprising:
   a volatile binary storage element having first and second power terminals for the application of an operating potential therebetween and having first and second input output (I/O) points;
   a bit line;
   means coupled between said bit line and one of said I/O points for selectively writing the information on said bit line into said volatile storage element or selectively reading out the information in said volatile storage element onto said bit line;
   a non-volatile storage element which can be programmed to eiter one of two conductive states; and
   means coupling said non-volatile storage element to one of said I/O points of said volatile storage elements for selectively transferring information from said non-volatile to said volatile section, said means including means for:
   (a) applying a given operating potential across said first and second power terminals of said volatile storage element when information is being written into said volatile section from said bit line or read out from said volatile section onto said bit line;
   (b) increasing said given operating potential across said volatile storage element when information is being transferred from said volatile section to said non-volatile section; and
   (c) decreasing said given operating potential across said volatile storage element relative to the non-volatile storage element when information is being transferred from said non-volatile section to said volatile section.

* * * * *

UNITED STATES PATENT AND TRADEMARK OFFICE
CERTIFICATE OF CORRECTION

PATENT NO. : 4,354,255

DATED : October 12, 1982

INVENTOR(S) : Roger Green Stewart

It is certified that error appears in the above-identified patent and that said Letters Patent is hereby corrected as shown below:

Col. 2, line 19 change "P1" to --- P2 ---.

Col. 3, line 62 change "swtich" to --- switch ---.

Col. 4, line 58 change "(10volts)" to --- (10 volts) ---.

Col. 10, line 42 change "eiter" to --- either ---.

Signed and Sealed this

Fourteenth Day of December 1982

[SEAL]

Attest:

GERALD J. MOSSINGHOFF

Attesting Officer     Commissioner of Patents and Trademarks